US007719254B2

(12) United States Patent
Meyer et al.

(10) Patent No.: US 7,719,254 B2
(45) Date of Patent: May 18, 2010

(54) METHOD FOR SETTING A REFERENCE POTENTIAL OF A CURRENT SENSOR AND ARRANGEMENT FOR DETERMINING THE REFERENCE POTENTIAL OF A POWER SEMICONDUCTOR DEVICE

(75) Inventors: Thorsten Meyer, Munich (DE); Mathias Hans-Ulrich Alexander von Borcke, Munich (DE); Markus Winkler, Munich (DE)

(73) Assignee: Infineon Technologies AG, Neubiberg (DE)

( * ) Notice: Subject to any disclaimer, the term of this patent is extended or adjusted under 35 U.S.C. 154(b) by 258 days.

(21) Appl. No.: 11/836,730

(22) Filed: Aug. 9, 2007

(65) Prior Publication Data

US 2008/0036445 A1    Feb. 14, 2008

(30) Foreign Application Priority Data

Aug. 10, 2006    (DE)    ............ 10 2006 037 554

(51) Int. Cl.
*G01R 29/00*    (2006.01)
*G01R 35/00*    (2006.01)
(52) U.S. Cl. ............... 324/72; 438/14; 361/93.1
(58) Field of Classification Search ............ None
See application file for complete search history.

(56) References Cited

U.S. PATENT DOCUMENTS

| 5,815,027 | A | | 9/1998 | Tihanyi et al. |
| 5,828,308 | A | * | 10/1998 | Fukami ............ 340/664 |
| 6,150,714 | A | * | 11/2000 | Andreycak et al. ...... 257/690 |
| 7,085,977 | B2 | * | 8/2006 | Marshall et al. ........ 714/726 |
| 7,277,264 | B2 | * | 10/2007 | Kitagawa ............ 361/93.1 |

FOREIGN PATENT DOCUMENTS

DE    195 20 735 A1    12/1996

\* cited by examiner

*Primary Examiner*—Timothy J Dole
*Assistant Examiner*—John Zhu
(74) *Attorney, Agent, or Firm*—Slater & Matsil, L.L.P.

(57) ABSTRACT

A method for setting a reference potential of a current sensor in a power semiconductor device is disclosed. On the basis of a specific geometry and a typical two-dimensional potential distribution of the power semiconductor device, a plurality of tapping points is predetermined on an area of the power semiconductor device. On the basis of the specific geometry of the power semiconductor device, a line course between the tapping points and a measuring point for measuring a potential average value is determined and realized. Respective potential values are detected at the tapping points and fed to the measuring point. The potential average value is determined at the measuring point. The potential of the current sensor is set to the potential average value thus determined.

25 Claims, 5 Drawing Sheets

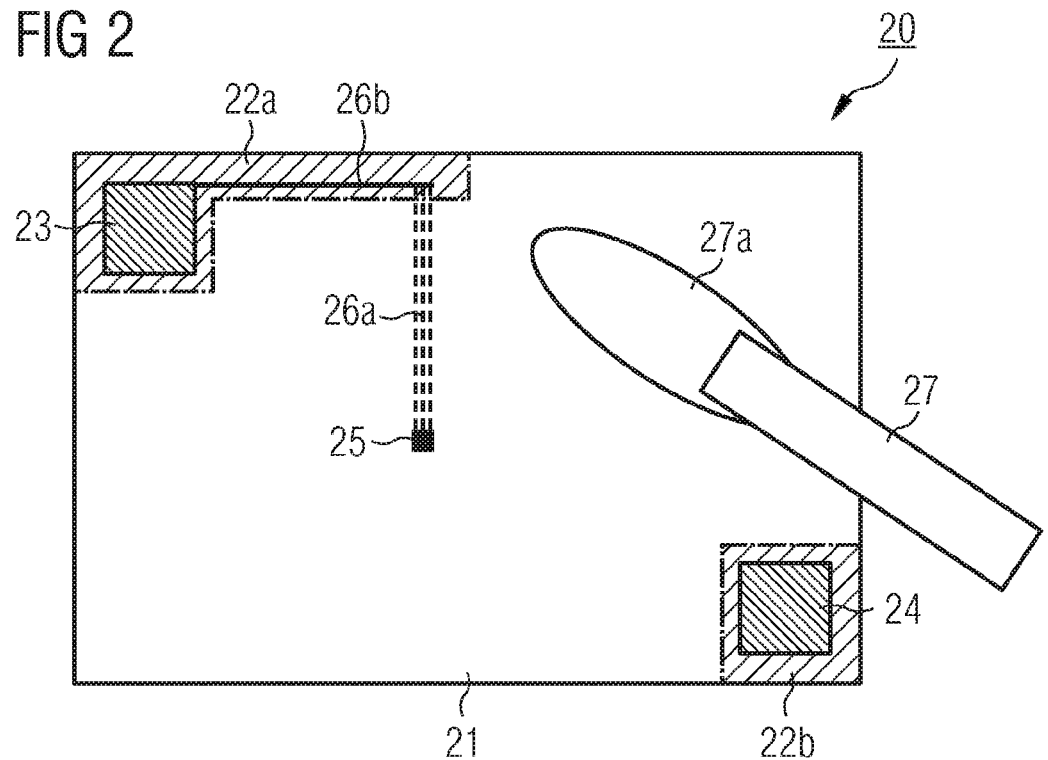
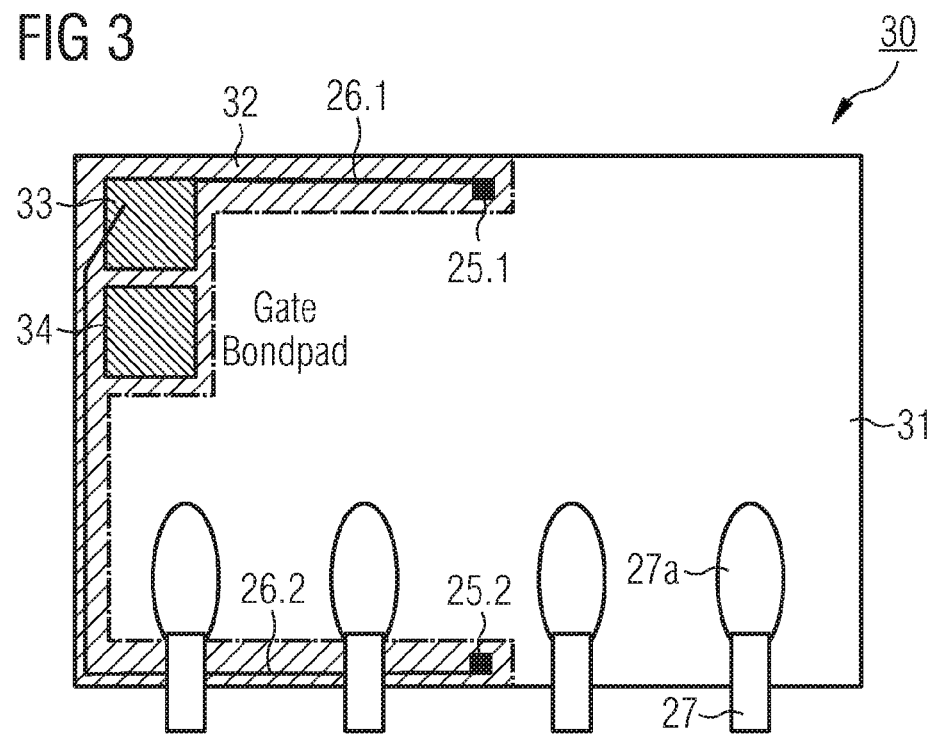

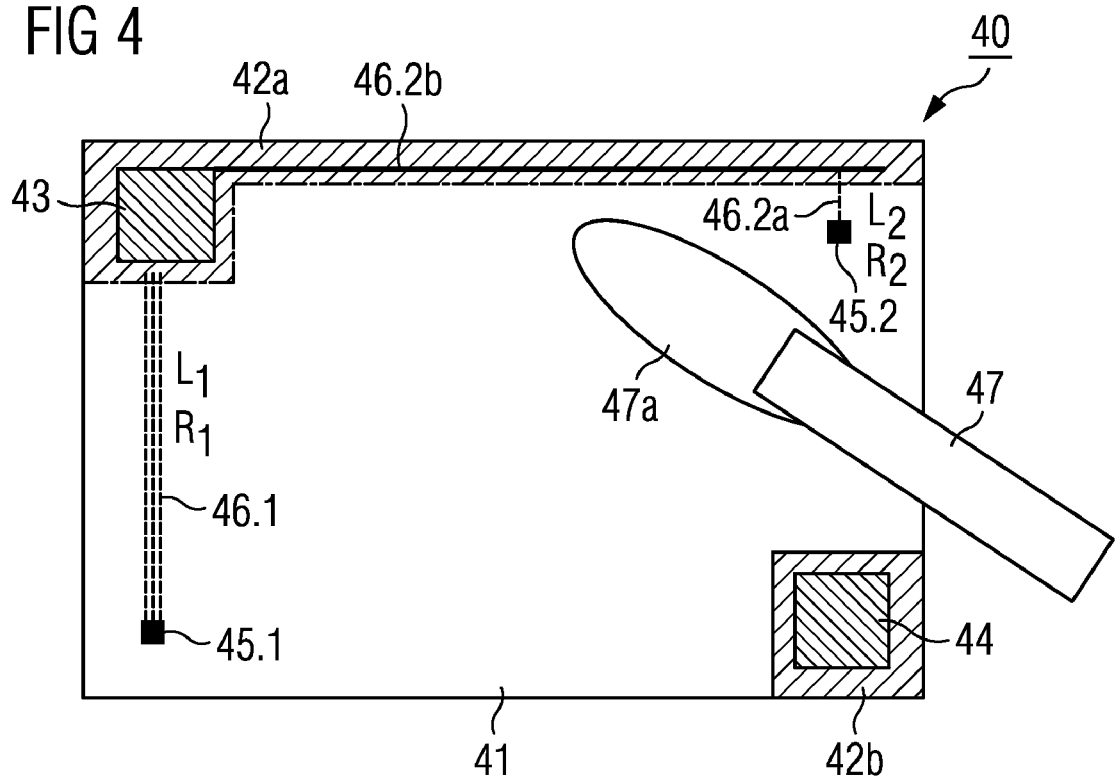
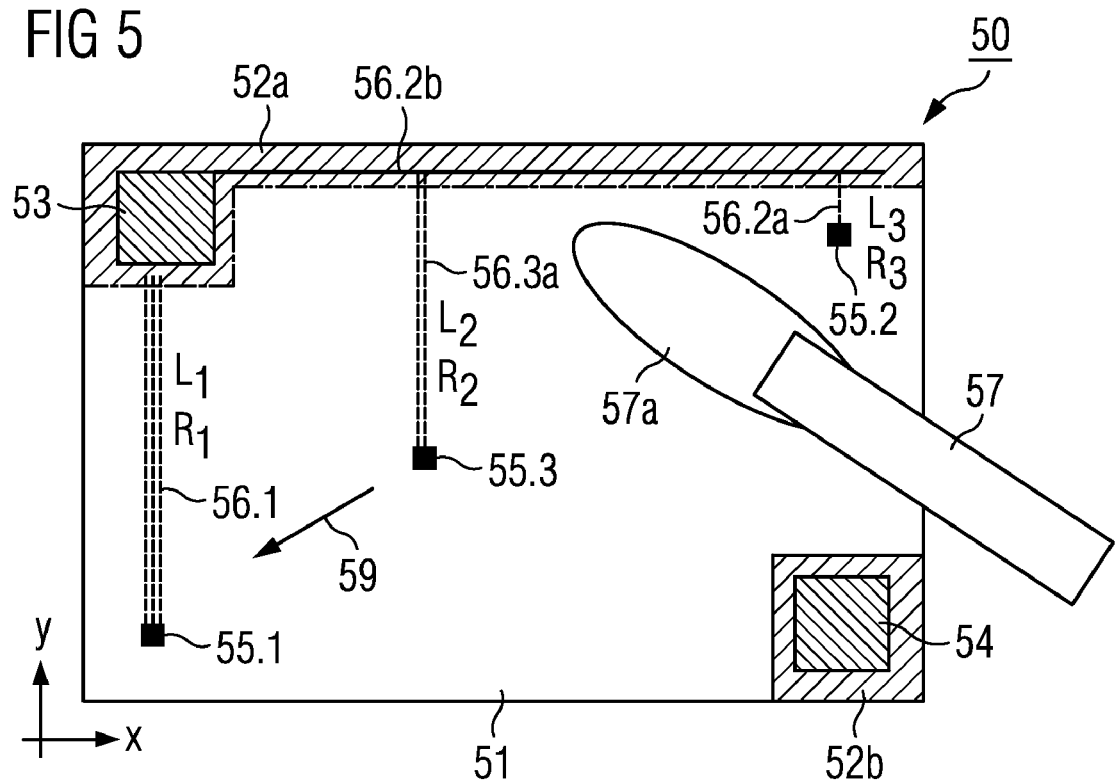

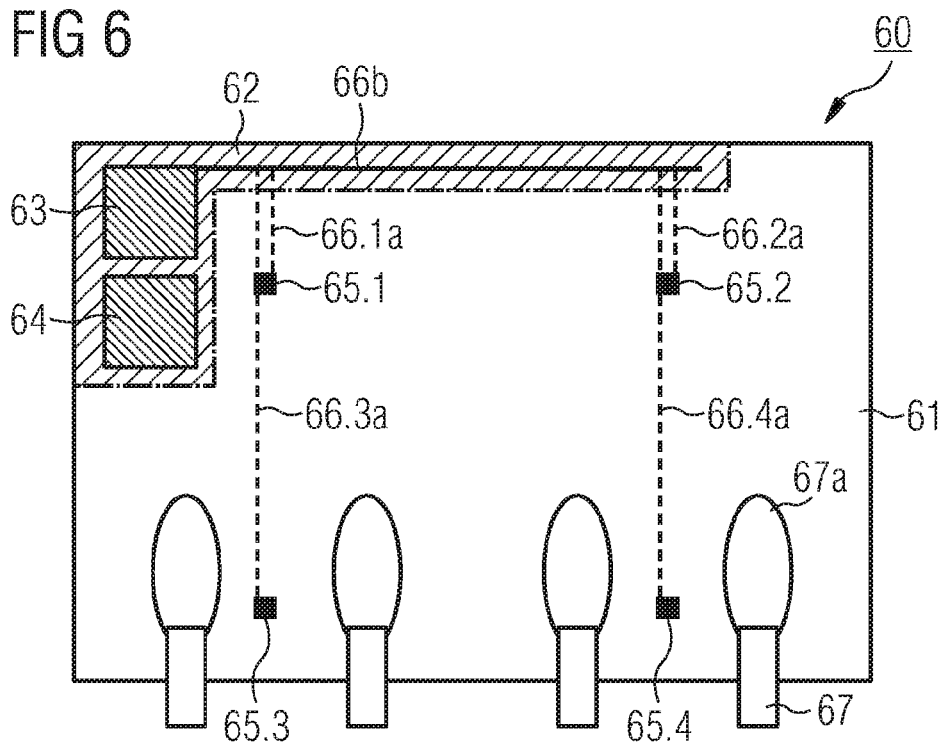
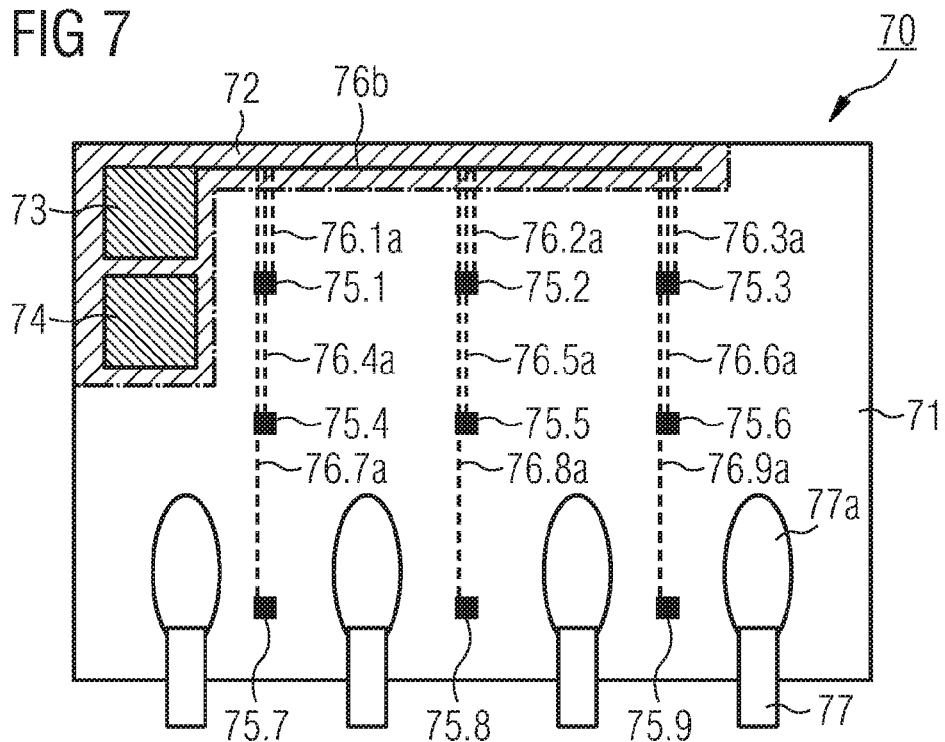

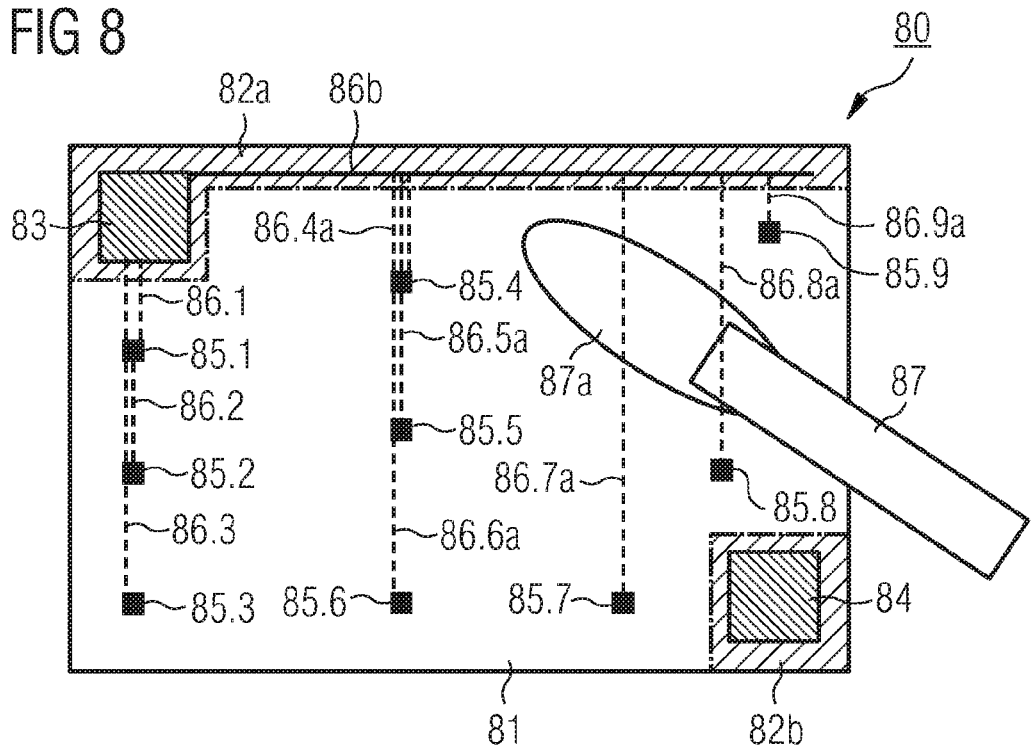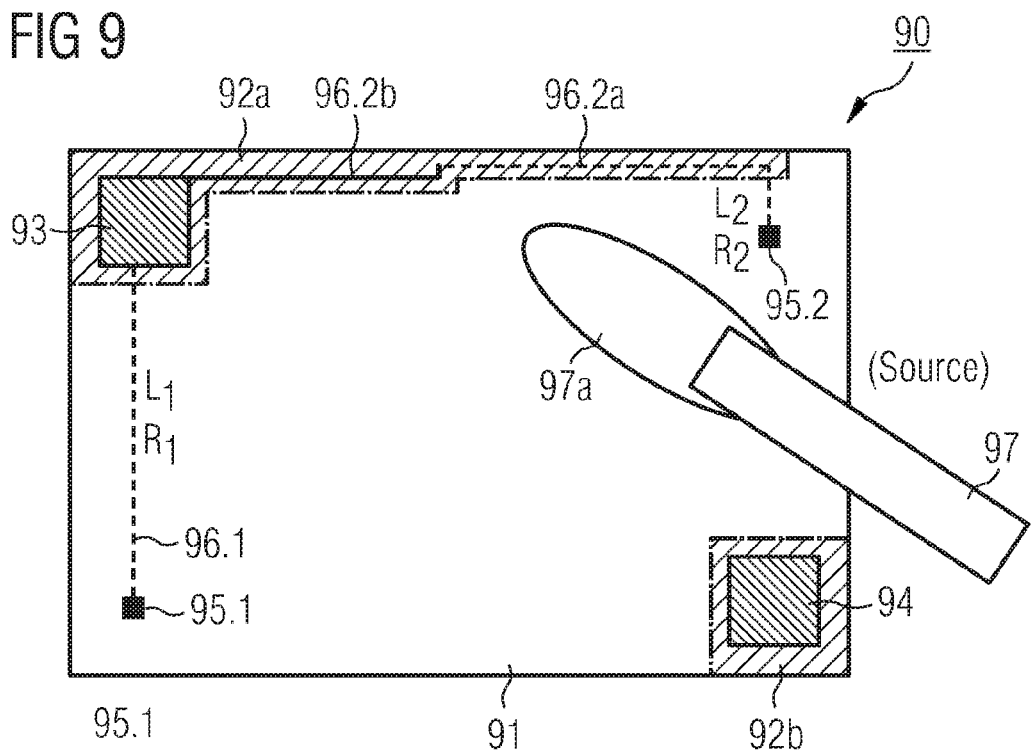

METHOD FOR SETTING A REFERENCE POTENTIAL OF A CURRENT SENSOR AND ARRANGEMENT FOR DETERMINING THE REFERENCE POTENTIAL OF A POWER SEMICONDUCTOR DEVICE

This application claims priority to German Patent Application No. 10 2006 037 554.8, which was filed Aug. 10, 2006, and is incorporated herein by reference.

TECHNICAL FIELD

The invention relates to a method for setting a reference potential of a current sensor, and to an arrangement for determining the reference potential of a power semiconductor device.

BACKGROUND

In power electronics, efforts have increasingly been made for a relatively long time to protect the integrated circuits used against overloading and to initiate suitable measures in the case of electrical or thermal overload. For this purpose, the current flow through a corresponding circuit, in particular a power semiconductor device, and/or the temperature thereof is usually detected and compared with predetermined limit values.

Thus, for realizing self-protecting MOS power semiconductor devices, it is known to provide a current sensor and a temperature sensor on the chip. In an embodiment which is likewise known and often put into practice, the current sensor is embodied as a small DMOS transistor that supplies a current proportional to the load current in the power switching device if the voltage values applied to it are the same as those applied to a load DMOS transistor. This small transistor, which is also referred to as a sense DMOS, has an area which is smaller than that of the load DMOS by a factor of 1,000 to 100,000. A current flows through it which is smaller, ideally by the geometrical ratio of the active areas, than the current flowing through the load DMOS and is therefore a measure of the latter current.

In the form of realization of a common-drain technology, the same drain potential and the same gate potential are present at both transistors. The source potential is tapped off suitably at the load DMOS, and the source potential of the sense DMOS is set to the same potential value. The current that flows in this state is then measured. The current serves as an indicator of the load current presently flowing through the load DMOS.

Conventionally, the source potential at the load DMOS is tapped off in various ways.

Thus, it is known to provide a metal tapping at a measuring point at the chip edge.

BRIEF DESCRIPTION OF THE DRAWINGS

Advantages and expediencies of the invention emerge, moreover, from the dependent claims and also the following description of preferred exemplary embodiments and embodiment aspects with reference to the figures, in which:

FIG. 2 shows a schematic illustration of a measuring arrangement for measuring the source potential at the load DMOS of the circuit of FIG. 1 with one tapping point;

FIG. 3 shows a schematic illustration of a measuring arrangement for tapping off the source potential of the load DMOS with two tapping points at the edge of the chip;

FIG. 4 shows a schematic illustration of one exemplary embodiment of the invention;

FIG. 5 shows a schematic illustration of a further exemplary embodiment of the invention;

FIG. 6 shows a schematic illustration of a further exemplary embodiment of the invention;

FIG. 7 shows a schematic illustration of a further exemplary embodiment of the invention;

FIG. 8 shows a schematic illustration of a further exemplary embodiment of the invention; and FIG. 9 shows a schematic illustration of a modification of the exemplary embodiment in accordance with FIG. 4.

SUMMARY

Figure 1:
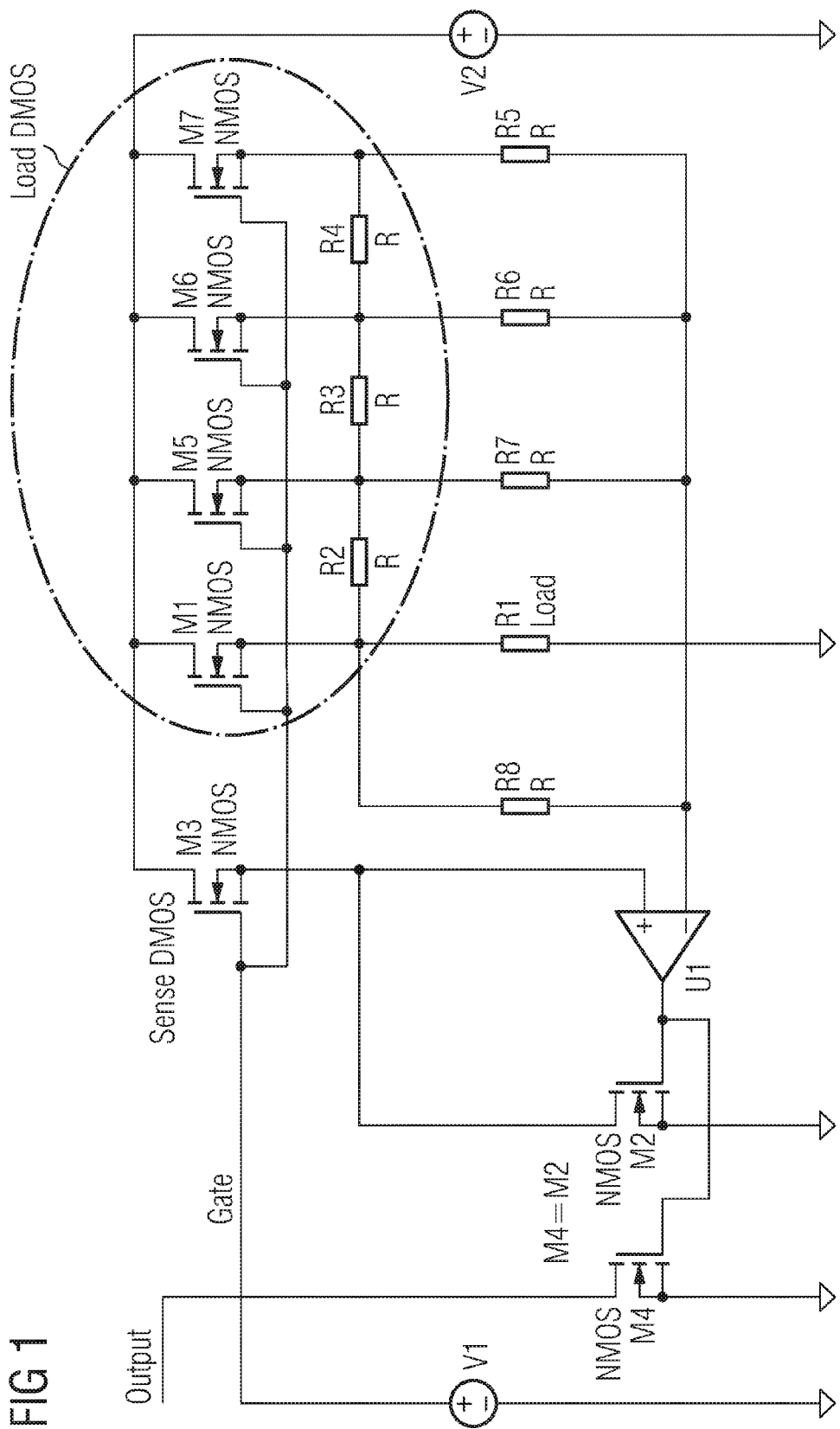
FIG. 1 shows a circuit diagram of a high-side switch with an n-DMOS as a power semiconductor device and a current sensor.

In one embodiment, a method for setting a reference potential of a current sensor in a power semiconductor device is disclosed. On the basis of a specific geometry and a typical two-dimensional potential distribution of the power semiconductor device, a plurality of tapping points are predetermined on the area of the power semiconductor device. On the basis of the specific geometry of the power semiconductor device, a line course between said tapping points and a measuring point for measuring a potential average value is determined and realized. Respective potential values are detected at the tapping points and fed to the measuring point. The potential average value is determined at the measuring point. The potential of the current sensor is set to the potential average value thus determined.

DETAILED DESCRIPTION OF ILLUSTRATIVE EMBODIMENTS

The invention offers the advantage of providing an improved method for setting the reference potential of a current sensor, and also a correspondingly improved measuring arrangement, which ultimately ensure a better function of the current sensor of a power semiconductor device.

In the method according to the invention for setting a reference potential of a current sensor in a power semiconductor device, firstly, on the basis of the specific geometry and a typical two-dimensional potential distribution of the power semiconductor device, a plurality of tapping points are predetermined as measuring points on the area of the power semiconductor device. It is furthermore provided that on the basis of the specific geometry of the power semiconductor device, a processing algorithm for potential values measured at the tapping points for determining a potential average value is predetermined and stored. On this basis, finally, the respective potential values are measured using the tapping points, and, finally, the potential of the current sensor is set by means of the actual potential average value determined with sufficient accuracy in this way.

Specifically referring to a MOS power semiconductor device (a DMOS), according to the invention the source potential is tapped off at a plurality of locations of the active area of the load DMOS and the measured source potential values are averaged over a suitable combination of length and number of lines leading to the tapping points, in a predetermined manner suitable for the specific arrangement. By means of a correspondingly optimized measuring method and an arrangement of this type, it is possible to determine a source potential average value which corresponds to a good approximation to the source potential actually present on average at the load DMOS. The invention can be applied in a similar manner also to an IGBT or similar power semiconductor devices.

One embodiment of the method proposed is for the tapping points to be obtained as the result of a simulation calculation for the specific geometry of the power semiconductor device. In the case of such a simulation calculation, alongside the specific geometry and source potential distribution of the load DMOS—in the sense of boundary conditions—it should be taken into consideration that as the number of tapping points increases, the area taken up for the measuring arrangement increases, but on the other hand the accuracy (insensitivity to process fluctuations, operating point, temperature and bonding accuracy) also increases.

A first embodiment of the tapping point arrangement in the case of a load DMOS with a one-dimensional potential gradient is the linear arrangement in the direction of the potential gradient. In the case of a source potential distribution which has a fall gradient in two directions, a two-dimensional arrangement of the tapping points is preferred which may in particular have more or less the form of a matrix arrangement. In such a matrix arrangement, however, it is not necessary either for all the matrix points to be provided with measuring taps or for these to have identical spacings.

In further embodiments of the invention it is provided that at least one portion of the tapping points is positioned on oxide-insulated poly-Si lines of the power semiconductor device (for instance in trenches). As an alternative or else in combination therewith it may be provided that at least one portion of the tapping points is positioned on metal interconnects and/or doping channels having sufficient conductivity of the MOS power semiconductor device. In any case the measuring arrangement and the method are configured in such a way that at least one tapping point, in particular a plurality of tapping points, is or are determined within the area of the power semiconductor device.

Furthermore, one embodiment of the method according to the invention is for the length of conductive tracks, in particular of the poly-Si lines, metal interconnects or doping channels, from a source bonding pad as far as the respective tapping points to be included in the processing algorithm. In this respect, the method proposed includes a processing algorithm that is based on the knowledge of the person skilled in the art with regard to known design algorithms.

FIG. 1 shows a circuit diagram of a MOS power semiconductor device with a load DMOS formed from the nMOS elements M1, M5, M6 and M7, and a sense DMOS M3, alongside which the resistance components R2, R3 and R4 resulting from the finite transverse conductivity of the front metallization are also of importance in the context of the invention. Further details of the circuit are not of significance here, and so the description thereof is dispensed with.

FIGS. 2 to 8 show in each case as schematic plan views different geometrical configurations of a load DMOS with a bonding pad serving as a measuring point for the tapping of the source potential by a voltage measuring device, and in each case at least one tapping point connected to the measuring point. The figures also show in each case a further bonding pad as a gate terminal, while the drain terminal is realized by a rear-side metallization (not illustrated) and the source terminal is realized by a front-side metallization (likewise not illustrated).

A non-active area of the DMOS is in each case demarcated by a dash-dotted line and hatched. Each of the figures also schematically shows at least one bonding wire with an associated pinch section which makes contact with the front-side metallization (not illustrated) for the source terminal of the DMOS.

In FIGS. 2 to 8, the taps discussed generally further above and described in more concrete terms below are in each case represented as small squares with dense hatching, metal interconnects to the taps are depicted as solid thick lines, and poly-Si lines are represented as dashed lines. The placing of a plurality of dashed lines alongside one another is not necessarily intended to denote the parallelism of a plurality of such poly-Si lines, but rather serves initially for optically distinguishing differently configured poly-Si connections with respect to different tapping points, with regard to which more detailed explanations are given below with reference to the individual figures. However, in practice it is entirely possible to connect a plurality of poly-Si lines in parallel for setting a resistance that is suitable with regard to the respective line length.

FIG. 2 shows a load DMOS 20 having an active area 21 and two passive area regions 22a, 22b around a first bonding pad 23 for measuring tapping of the source potential and a second bonding pad 24 as a gate terminal. A single tapping point 25 for tapping off the local source potential value is provided in the central region of the active area 21, and the tapping point 25 is connected to the measuring bonding pad 23 via a poly-Si line section 26a and a metal interconnect 26b. A bonding wire 27 with associated pinch region 27a serves for feeding the source voltage to the front-side metallization layer (source terminal).

Here as in the rest of the figures, the tapping point is to be conceived of as a vertical conductive contact-connection of the front-side metallization to the poly-Si line buried into a trench (or in some figures also directly to a metal interconnect section).

FIG. 3 shows in the same way as FIG. 2 a conventional arrangement, which involves attempting to detect a (coarsely) averaged source potential value of a load DMOS 30 having an active area 31 and a passive area 32 in the vicinity of a first bonding pad 33 for measuring tapping of the source potential and a second bonding pad 34 as a gate terminal with two peripheral tapping points 25.1, 25.2. The tapping points 25.1, 25.2 are connected to the measuring point (first bonding pad) 33 via metal interconnects 26.1, 26.2 running in the edge region.

FIG. 4 shows an embodiment of the arrangement according to the invention at a load DMOS 40 having an active area 41 and two passive areas 42a, 42b in the vicinity of a first bonding pad 43 for measuring tapping of the source potential and a second bonding pad 44 as a gate terminal. Two tapping points 45.1, 45.2 are provided in the region of the active area 41 of the load DMOS 40, the tapping points 45.1, 45.2 being conductively connected to the measuring point (first bonding pad) 43. The arrangement of a bonding wire 47 for connecting the front-side metallization to a source voltage corresponds to that in FIG. 2.

The conductive connection between the tapping point 45.1 and the associated bonding pad 43 is produced here via a relatively long poly-Si conductor structure 46.1, which, owing to the long length $L_1$ is preferably formed from a parallel connection of a plurality of poly-Si lines (provided in the component structure) in trenches with a parallel connection resistance $R_1$. By contrast, the conductive connection of the second tapping point 45.2 to the measuring point 43 is formed over by far the greatest part of the length by a metal interconnect 46.2b having a practically negligible resistivity, and only a short final section having the length $L_2$ is formed as a poly-Si line 46.2a with the resistance $R_2$. Owing to its shortness, this section can be formed perfectly well by an individual poly-Si line of the already present component structure.

FIG. 5 shows a further embodiment of the arrangement according to the invention at a load DMOS 50. The embodiment corresponds to the greatest possible extent to that according to FIG. 4, such that the reference numerals in FIG. 5 have also been based on those in FIG. 4 and the description of the corresponding parts or regions is not repeated here.

A third tapping point 55.3 is added, which is positioned in the central region of the active area 51 and is connected to the measuring point 53 via a combination of a section of the metal interconnect 56.2b and a poly-Si line 56.3a. The latter has a length $L_2$ and a resistance $R_2$, which, in view of the length lying between the values $L_1$ of the line 56.1 and $L_3$ of the line 56.2a, should expediently lie between the resistance values of those lines. Here, too, a parallel connection of a plurality of poly-Si lines of the component structure is therefore expediently suitable.

The embodiments shown in FIGS. 4 and 5 are distinguished by an essentially linear arrangement of the respective tapping points for the local source potential values, such as can basically preferably be used for component configurations in which an approximately one-dimensional gradient 59 of the source potential having components in the x and y directions could also be detected. Expediently, the tapping points 55.1, 55.2, 55.3 are then positioned approximately on the straight line defining the fall direction of the source potential. In the abovementioned figures, however, a two-dimensional fall gradient is present; however, in this case, too, an essentially linear tapping configuration can supply sufficiently accurate measured values.

Specifically referring to the arrangement of FIGS. 4 and 5, where a rather two-dimensional gradient is present, the following should be noted: a two-dimensional falling potential gradient is established for example in arrangements in which an individual bonding pad is provided near a corner of the semiconductor arrangement, while a largely one-dimensional fall is manifested when a plurality of bonding wires distributed along a lateral edge are provided (such as, for instance, in FIG. 3, 6 or 7—see below). However, when the current is distributed nonuniformly between the bonding wires, a potential gradient fall that tends to be two-dimensional can occur in such cases as well.

It is at the discretion of the developer to choose a linear or matrix-type arrangement in order to harmonize the requirements for sufficient measurement accuracy and low realization outlay. If a sufficiently good result can be obtained with a linear arrangement, this arrangement can also be chosen for a configuration with a two-dimensional fall gradient owing to the advantage of saving space, and, on the other hand, a matrix arrangement may also be preferred for a configuration with approximately one-dimensional fall gradients (as in FIG. 7), in the interests of higher current measurement accuracy.

FIG. 6 shows a first embodiment of such an arrangement at a load DMOS 60 having an active area 61 and a passive area 62 around a first bonding pad 63 for measuring tapping of the source potential and a second bonding pad 64 as a gate terminal. Here, as in the embodiment according to FIG. 3 as described further above, the source voltage is fed to the front-side metallization of the chip by means of four bonding wires 67 each with associated pinch sections 67a, the bonding wires 67 being arranged parallel to one another.

In this case, four tapping points 65.1 to 65.4 are distributed over the active area 61 and are conductively connected to the first bonding pad 63 in each case via a section of a metal interconnect 66b and a poly-Si line section 66.1a, 66.2a, 66.3a and 66.4a, respectively, that branches off from the interconnect 66b. By analogy with the explanations further above, it should be taken into account here, too, that the tapping points 65.3, 65.4 with relatively long poly-Si line linking, for obtaining an expediently weighted source potential average value, have poly-Si line sections having a lower "length-specific" resistance (here meant as total resistance relative to a unit length of a poly-Si interconnect or a plurality of interconnects connected in parallel) than the tapping points 65.1, 65.2, which are connected to the metal interconnect 66b only via very short poly-Si lines.

The further arrangement according to the invention in accordance with FIG. 7 is largely comparable to the above-described embodiment according to FIG. 6, and so here, too, once again corresponding reference numerals have been used and a description of parts or regions that are identical or correspond functionally to one another can be dispensed with. The essential difference is that in the present embodiment, a total of nine tapping points 75.1 to 75.9 are provided in a manner distributed suitably over the active area 71 of the load DMOS 70.

These tapping points 75.1 to 75.9 too, as in the previous embodiment, are connected to the first bonding pad 73 for measuring tapping of the source potential in each case via a section of a metal interconnect 76b and poly-Si line sections 76.1a to 76.9a, respectively. The basic explanations further above apply to the choice of the respective suitable resistance value of the poly-Si line sections and hence the optional formation thereof from a plurality of parallel trench lines sections of the component structure. Thus, in an expedient manner, the lines sections 46.1a to 46.3a could in each case be formed from an individual poly-Si line in a trench, the line sections 76.4a to 76.6a could be formed by parallel connection of the poly-Si lines in three trenches, and the line sections 46.7a to 46.9a could be formed by parallel connection of the poly-Si lines in five trenches.

Finally, the embodiment shown in FIG. 8 represents in a certain sense a combination of the "one-dimensional" tapping type according to FIGS. 4 and 5 with the "two-dimensional" tapping type according to FIGS. 6 and 7.

As can be discerned in the figure, a total of nine tapping points 85.1 to 85.9 are distributed largely uniformly over the active area 81 of the load DMOS 80, said tapping points all being conductively connected to a first bonding pad 83 for measuring tapping of the source potential. While the tapping points 85.1 to 85.3, which can be seen vertically one below another in the left-hand region of the figure, are connected to the first bonding pad 83 in each case exclusively via a poly-Si line 86.1 to 86.3, the line connection of the remaining tapping points 85.4 to 85.9 comprises in each case a section of a metal interconnect 86b and poly-Si lines 86.4a to 86.9a, respectively. The considerations mentioned further above with regard to the dimensioning and partial configuration by parallel connection of the poly-Si lines in a plurality of trenches running parallel hold true for these interconnect sections.

FIG. 9 shows a modification of the first exemplary embodiment explained further above with reference to FIG. 4. The reference numerals are therefore based on those in FIG. 4, and reference is made essentially to the explanation given above. The modification consists in the fact that the line between the first bonding pad 93 and the tapping point 95.2 has a different length apportioning between a poly-Si section 96.2a and a metal section 96.2b. Specifically, the poly-Si section 96.2a is lengthened (with simultaneous reduction of the length of the metal section 96.2b) in order to bring it to the same length as the poly-Si interconnect 96.1 leading to the first tapping point 95.1. No particular measures are thereupon necessary for setting the "specific" resistance of the two lines. In particular, the two lines can be formed from an individual poly-Si interconnect present.

The embodiment of the invention is not restricted to the above-described exemplary embodiments and highlighted aspects, but rather is likewise possible in a multiplicity of modifications that lie within the scope of expert action.

What is claimed is:

1. A method for setting a reference potential of a current sensor in a power semiconductor device, the method comprising:
   predetermining a plurality of tapping points on an area of the power semiconductor device, the tapping points being predetermined on the basis of a potential distribution of the power semiconductor device;
   determining and realizing a line course between the tapping points and a measuring point for measuring a potential average value;
   detecting respective potential values at the tapping points;
   feeding the potential values to the measuring point;
   determining a potential average value at the measuring point; and
   setting a potential of a current sensor to the determined potential average value.

2. The method as claimed in claim 1, wherein the power semiconductor device comprises a MOS power semiconductor device and wherein the current sensor comprises a MOS current sensor.

3. The method as claimed in claim 1, wherein the tapping points and the line course are obtained as the result of a simulation calculation for the potential distribution of the power semiconductor device.

4. The method as claimed in claim 1, wherein predetermining the plurality of tapping points comprises predetermining the tapping points for a potential distribution essentially having a one-dimensional potential gradient, an essentially linear arrangement of tapping points in the direction of the potential gradient being predetermined.

5. The method as claimed in claim 1, wherein predetermining the plurality of tapping points comprises predetermining a two-dimensional arrangement of tapping points for a potential distribution having potential gradients in an x-y plane.

6. The method as claimed in claim 5, wherein the two-dimensional arrangement comprises a completely or incompletely occupied matrix arrangement.

7. The method as claimed in claim 1, wherein at least one portion of the tapping points is realized with oxide-insulated polysilicon lines of the power semiconductor device.

8. The method as claimed in claim 1, wherein at least one portion of the tapping points is realized with metal interconnects and/or doping channels of the power semiconductor device.

9. The method as claimed in claim 1, wherein determining the line course comprises determining a length and a width of a conductor from the measuring point as far as the respective tapping points.

10. The method as claimed in claim 9, wherein the conductor comprises polysilicon lines, metal interconnects or doping channels.

11. The method as claimed in claim 1, wherein at least one tapping point is determined based on an active area of the power semiconductor device.

12. The method as claimed in claim 11, wherein a plurality of tapping points is determined based on the active area of the power semiconductor device.

13. An arrangement for determining a reference potential of a power semiconductor device as a setting value for a current sensor assigned to the power semiconductor device, the arrangement comprising:
   a measuring point for measurement tapping of the reference potential;
   a voltage measuring device that can be contact-connected to the measuring point;
   a plurality of tapping points based on a potential distribution of the power semiconductor device over an area of the power semiconductor device; and
   a plurality of lines between the tapping points and the measuring point for feeding potential values existing at the tapping points to the measuring point.

14. The arrangement as claimed in claim 13, wherein the power semiconductor device comprises a MOS power semiconductor device.

15. The arrangement as claimed in claim 13, wherein the tapping points comprise an essentially linear arrangement of tapping points.

16. The arrangement as claimed in claim 13, wherein the tapping points comprise a two-dimensional arrangement of tapping points.

17. The arrangement as claimed in claim 16, wherein the tapping points comprise a completely or incompletely occupied matrix arrangement.

18. The arrangement as claimed in claim 14, wherein at least one portion of the tapping points is realized with oxide-insulated polysilicon lines of the MOS power semiconductor device.

19. The arrangement as claimed in claim 14, wherein at least one portion of the tapping points is arranged at metal interconnects and/or on doping channels of the MOS power semiconductor device.

20. The arrangement as claimed in claim 14, wherein at least one tapping point is arranged at an active area of the MOS power semiconductor device.

21. The arrangement as claimed in claim 20, wherein a plurality of tapping points is arranged at the active area of the MOS power semiconductor device.

22. The arrangement as claimed in claim 13, wherein the lines connecting the respective tapping points to the measuring point are realized in such a way that their total "length-specific" resistance is smaller, the greater their length.

23. The arrangement as claimed in claim 22, wherein the lines connecting the respective tapping points to the measuring point are realized by determining a width and/or a number of lines and/or by suitable doping concentration for each line.

24. The arrangement as claimed in claim 22, wherein at least one portion of the lines is formed by connecting in parallel a plurality of interconnects present in the power semiconductor device.

25. The arrangement as claimed in claim 24, wherein the interconnects comprise oxide-insulated polysilicon lines or doping channels.

* * * * *